United States Patent [19]

Irving

[11] 4,440,802
[45] Apr. 3, 1984

[54] PREPARATION OF PREPREGS FROM CELLULOSIC FIBERS USING WATER-BORNE RESIN COMPOSITIONS

[75] Inventor: Edward Irving, Burwell, England

[73] Assignee: Ciba-Geigy Corporation, Ardsley, N.Y.

[21] Appl. No.: 479,404

[22] Filed: Mar. 28, 1983

[30] Foreign Application Priority Data

Apr. 3, 1982 [GB] United Kingdom ............... 8209955
Aug. 5, 1982 [GB] United Kingdom ............... 8222600

[51] Int. Cl.³ .................. B05D 3/06; B05D 3/02
[52] U.S. Cl. .................. 427/54.1; 156/275.5; 156/307.4; 427/381; 427/382
[58] Field of Search ............ 427/54.1, 381, 386, 427/382, 389.9, 392, 391; 156/272, 330

[56] References Cited

U.S. PATENT DOCUMENTS

| | | | |
|---|---|---|---|
| 3,256,226 | 6/1966 | Fekete et al. | 204/159.15 X |
| 3,373,075 | 3/1968 | Fekete et al. | 204/159.15 X |
| 3,808,226 | 4/1974 | Habermeier et al. | 548/312 X |
| 3,847,769 | 11/1974 | Garratt et al. | 204/159.22 |
| 3,996,121 | 12/1976 | Green et al. | 204/159.23 |
| 4,092,443 | 5/1978 | Green | 427/53.1 |
| 4,108,803 | 8/1978 | Green et al. | 204/159.22 X |
| 4,162,274 | 7/1979 | Rosenkranz | 204/159.19 X |
| 4,253,918 | 3/1981 | Traenckner et al. | 204/159.22 |
| 4,309,529 | 1/1982 | Wendling | 528/289 |
| 4,323,591 | 4/1982 | Wendling et al. | 427/53.1 |
| 4,358,477 | 11/1982 | Nooman et al. | 427/54.1 |

FOREIGN PATENT DOCUMENTS 1006587 10/1965 United Kingdom .
1139100  1/1969 United Kingdom .
1362906  8/1974 United Kingdom .
1400286  7/1975 United Kingdom .
1489425 10/1977 United Kingdom .

OTHER PUBLICATIONS

Derwent, 44508 D/25, EP 30,213.
Derwent, 52728 B/29, DT 2,800,356.

Primary Examiner—Thurman K. Page
Attorney, Agent, or Firm—Luther A. R. Hall

[57] ABSTRACT

Heat-curable prepregs are made by impregnating cellulosic fibers with a water-borne composition containing (a) a photopolymerizable resin of specified structure and (b) an epoxide resin, preferably together with a sensitizer for (a) and a heat-hardening agent for (b). Component (a) contains both hydrophobic and hydrophilic units and serves to keep the hydrophobic epoxide resin (b) suspended in the aqueous composition during impregnation, it then solidifying on exposure to actinic radiation. Subsequently the prepregs are heated to cure (b).

Component (a) is a di(meth)acrylate containing groups of formula

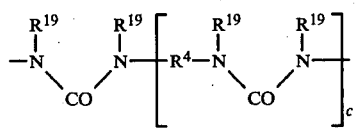

or

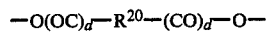

where
each $R^{19}$ denotes alkyl or each pair of $R^{19}$ denotes $-(CH_2)_2-$, $-C(R^{21}R^{22})CO-$, $-CH_2CH(CH_3)-$, $-(CH_2)_3-$, or $-(CO)_2-$,
$R^4$ denotes a (cyclo)aliphatic or araliphatic radical, pg,2
c and d are each zero or 1,
$R^{20}$ denotes an aliphatic group or, if each d is 1, it may denote

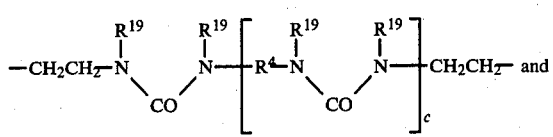

$R^{21}$ and $R^{22}$ each represent $-H$ or alkyl, or, conjointly, a cycloaliphatic ring.

10 Claims, No Drawings

PREPARATION OF PREPREGS FROM CELLULOSIC FIBERS USING WATER-BORNE RESIN COMPOSITIONS

BACKGROUND OF THE INVENTION

This invention relates to a process for making heat-curable prepregs from cellulosic fibers and to composites obtained by heat-curing such prepregs.

Laminated products prepared from heat-curable cellulosic "prepregs" are used industrially, for example in the production of baseboards for printed electrical circuits. These fibre-reinforced materials are commonly made by impregnating cellulosic fibres with an aqueous solution of a phenol-formaldehyde resin, heating the fibres to dry them, re-impregnating the fibres with a solution of an epoxide resin in an organic solvent, and then drying to form a heat-curable prepreg. Lastly, the prepreg is heated under pressure (usually in the form of stacked layers) to cure the epoxide resin and so form a composite.

The reason why it is necessary to employ two separate impregnation and drying cycles is that epoxide resins are, in general, too hydrophobic to impregnate cellulosic fibres directly; the fibres have first to be rendered less hydrophilic by treatment with an aqueous solution of a phenolic resin.

Because of the need for two impregnation stages and two drying stages the process is relatively costly, slow and complicated to carry out. It also has the disadvantage that an organic solvent is needed for the second impregnation, involving possible risks of toxicity and flammability and also costs of recovery of the organic solvent.

We have now found that these disadvantages can be substantially overcome by use of a process involving a single impregnation stage with a water-borne, heat-hardenable formulation containing an epoxide resin together with a member of a certain class of photopolymerisable resin.

GB No. 1 006 587 discloses adducts of diglycidyl ethers with (meth)acrylic acid. Amongst the adducts disclosed are those of formula

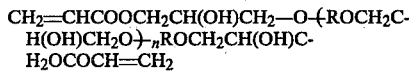
$$\text{CH}_2=\text{CHCOOCH}_2\text{CH(OH)CH}_2-\text{O-(ROCH}_2\text{C-H(OH)CH}_2\text{O-)}_n\text{ROCH}_2\text{CH(OH)C-H}_2\text{OCOCH}=\text{CH}_2 \quad \text{I}$$

where R is a divalent aliphatic radical derived from an alkanediol or a polyalkylenediol and n is 0 to 20. The adducts are heat-polymerised and cured using peroxide initiators.

GB No. 1 139 100 discloses polymerisable products, having terminal unsaturation and being free of unreacted epoxy groups, prepared by reacting (a) 1 mol. of a diepoxide, (b) 0.5 to 0.9 mol. of a dicarboxylic acid, and (c) 1.0 to 0.2 mol. of acrylic, methacrylic or crotonic acid, or a half-ester of fumaric or maleic acid. The sequence of reaction preferably involves initial reaction between (a) and (b) to produce an advanced epoxide resin and then reaction of the latter with the unsaturated monocarboxylic acid. The epoxide resin (a) is a diglycidyl ether of a dihydric phenol or alcohol. The products are polymerised and cured using peroxide initiators.

GB No. 1 362 906 discloses adducts of (meth)acrylic acid with epoxide resins, obtained by advancing an epoxide resin with a carboxyl-terminated polyester. The starting epoxide resin may be a diglycidyl ether, a diglycidyl ester, or a N-heterocyclic polyglycidyl compound such as an N,N-diglycidylhydantoin. The (meth)acrylate-terminated adducts can be polymerised using free radical initiators and are useful in the production of moulded articles.

GB No. 1 367 207 discloses adducts of n moles of (meth)acrylic acid with 1 mole of a polyglycidyl compound of formula

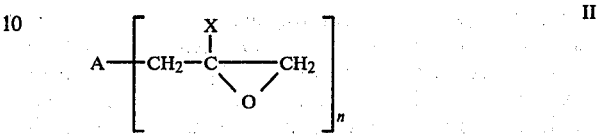

where A is a radical containing at least one group of formula

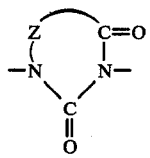

wherein Z is a divalent radical required to complete a 5- or 6-membered heterocyclic ring, X is —H or —CH₃, and n is 2 or 3. Preferred polyglycidyl compounds include diglycidyl derivatives of hydantoins. In Examples, diacrylates are prepared by advancing 1-glycidyl-3-(2'-glycidyloxy-n-propyl)-5,5-dimethylhydantoin with sebacic acid and reacting the advanced resin with acrylic acid. The adducts can be polymerised by means of free radical initiators.

GB No. 1 399 135 discloses the curing of these adducts with ionising radiation. This patent has a generic disclosure regarding the use of advanced epoxide resins, viz., that polyglycidyl compounds containing more than two of the heterocyclic residues can be prepared by reacting dicarboxylic acids with diglycidyl compounds in the appropriate molar ratio.

GB No. 1 400 286 discloses the curing of the (meth)acrylate adducts of GB No. 1 362 906 with ionising radiation.

GB No. 1 456 486 discloses air-drying, photocurable coating compositions based on a product obtained by reacting at least 60% of the epoxide groups of a polyepoxide with 0.01 to 0.5 NH-equivalent, per epoxide equivalent, of ammonia, an aliphatic or cycloaliphatic primary or secondary amine or a mixture of these compounds, and subsequently with 0.99 to 0.5 carboxyl equivalent of acrylic and/or methacrylic acid. Specified polyepoxides include glycidyl ethers of polyhydric alcohols (including 1,4-butanediol) and phenols, and polyglycidyl esters; aromatic polyepoxides are preferred. The epoxide-ammonia and epoxide-amine products are said to be 2-hydroxypropyl ethers containing free epoxide groups. The coating compositions are said to harden very rapidly, even in the presence of atmospheric oxygen, especially using α-substituted benzoins as photoinitiators, and to be particularly suitable for coating paper and cardboards.

GB No. 1 489 425 discloses photocurable resin compositions comprising a modified epoxide resin and a photosensitiser. The modified epoxide resin has a molecular weight of 700 to 5000, has polymerisable unsaturated residues linked to the main chain via ester bonds so as to provide the resin with an unsaturation equivalent of 200 to 3000, and also has —COOH groups linked to the main chain to provide the resin with an acid value in the range 30 to 150. One of the specified preparative routes involves reaction of an epoxide resin with a dicarboxylic acid to produce an advanced resin, which is then reacted with (meth)acrylic acid to give a (meth)acrylate-terminated resin, which is in turn reacted (via its —OH groups) with a dicarboxylic acid anhydride. Suitable advancing dicarboxylic acids mentioned include various saturated and unsaturated aliphatic acids. In an Example, a bisphenol A diglycidyl ether is advanced with adipic acid and the advanced resin is reacted with acrylic acid to give an intermediate product.

GB No. 1 521 933 discloses resins which are soluble in water before exposure to actinic radiation but which, on exposure to actinic radiation, polymerise and become insoluble in water, the said resins having the general formula each c is 1, it may alternatively represent a group of formula

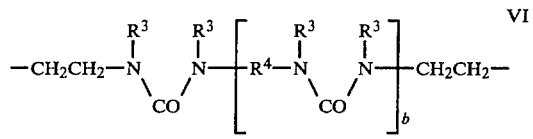

$R^6$ represents a hydrogen atom or an alkyl group of 1 to 4 carbon atoms, and $R^7$ and $R^8$ each represent a hydrogen atom or a methyl or ethyl group.

GB No. 1 537 909 discloses UV-crosslinkable urethane resins containing vinyl and carboxy groups which are prepared by reacting an epoxide resin with (meth)acrylic acid so that 60% to 100% of the epoxide groups are converted into β-hydroxyester groups, converting some of these hydroxy groups into the corresponding urethanes by reaction with an isocyanate, and reacting

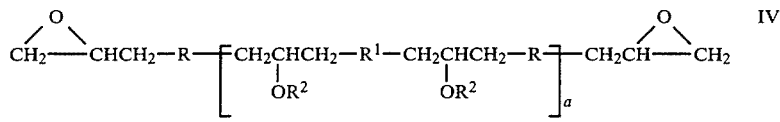

where a is an integer of average value of at least 1, but preferably not more than 100, each R and $R^1$ represents a group of formula

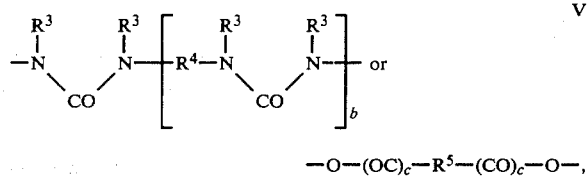

each $R^2$ represents a hydrogen atom or a group of formula —$(CH_2NH)_dCOC(R^6)=CH_2$, with the proviso that at least 1, and preferably at least 25%, of the 2a groups $R^2$ are other than a hydrogen atom, each $R^3$ denotes an alkyl group of 1 to 4 carbon atoms, or conjointly each pair represents a group of formula —$CH_2CH_2$—, —$C(R^7R^8)CO$—, —$CH_2CH$—, —$CH_2CH_2CH_2$—,
$\phantom{—C(R^7R^8)CO—, —}|$
$\phantom{—C(R^7R^8)CO—, —}CH_3$ —COCO—, —COCOCO—, or —COC(OH)_2CO—, $R^4$ represents a divalent aliphatic, cycloaliphatic, or araliphatic radical of 1 to 8 carbon atoms, especially an alkylene group of 1 to 6 carbon atoms, b, c, and d are each zero or 1, $R^5$ represents a straight or branched chain aliphatic group of 2 to 20 atoms, such as one of 2 to 9 carbon atoms, especially an alkylene group which may be interrupted by one or more carbonyloxy groups or by one or more ether oxygen atoms, or, providing the remaining hydroxy groups with a dicarboxylic acid anhydride. The epoxide resin may be pre-advanced by reaction with e.g., aliphatic or aromatic diacids. In an Example, a diglycidyl ether of bisphenol A is advanced with adipic acid and then reacted with acrylic acid to give an intermediate product.

EP No. 0 008 837 discloses a radiation-curable liquid coating composition based on (a) an epoxide resin containing at least one (meth)acryloyl group, (b) a photoinitiator, and (c) a crosslinking agent for the epoxide groups in (a). The resin (a) may be obtained by reacting an epoxide resin with a deficiency of (i) (meth)acrylic acid or (ii) a half ester of a hydroxysubstituted (meth)acrylate and a polycarboxylic acid or anhydride. The epoxide resin may be a hydantoin-based resin. Many types of crosslinking agent (c) are specified, those which are active at room temperature being preferred. In a special embodiment, an emulsifier is added to the resin (a) so that it can be diluted with water when mixed with a suitable crosslinking agent such as polyaminoamide. Curing of the composition is effected in two stages: in the first stage it is irradiated with UV light, and in the second, cure is completed by reaction of the epoxide groups with (c).

EP No. 0 030 213 discloses a photocrosslinkable layer which is water-developable after exposure, comprising a crosslinkable unsaturated monomer or oligomer, based on (meth)acrylic acid-modified epoxide resins with an acid value of less than 0.2, and a photoinitiator. There is used in an Example an adduct of acrylic acid with an epoxide resin obtained by advancement of neopentyl glycol diglycidyl ether with bisphenol A.

U.S. Pat. No. 4,309,529 discloses water-dispersible energy-curable polyesters having hydantoin groups and "backbone" alpha-methylene groups (=$CH_2$). These polyesters have repeating units of formula:

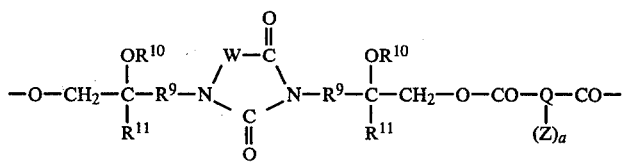

VII where R⁹ is a single bond or an alkylene group optionally having one catenary oxygen, R¹⁰ is —H, —COR¹² or —CONHR¹³, R¹¹ is —H or —CH₃, wherein R¹² is alkyl or alkenyl optionally substituted by phenyl or carboxyl and R¹³ is aliphatic or aromatic hydrocarbyl, W is a divalent group required to complete a 5- or 6-membered ring, Q is the divalent or trivalent residue of hydrocarbyl di- or tri-carboxylic acids formed by the removal of active hydrogens from the —COOH groups, containing up to 40 carbon atoms and optionally containing catenary oxygen atoms, Z is —COOH, and a is 0 or 1, but can be 1 for no more than 20 mole % of the acids.

In the principal statement of the invention, it was specified that at least 10 mole % of the acids from which Q is derived should have alpha-methylene groups. The polyesters are generally prepared by reaction of a heterocyclic diepoxide with a dicarboxylic acid; when an excess of diepoxide is used, polyesters having terminal epoxide groups are obtained, which groups can be reacted with (meth)acrylic acid. Many diglycidyl derivatives of hydantoins are suggested for use as the heterocylic diepoxide. Specified dicarboxylic acids include many saturated and unsaturated aliphatic and aromatic acids. For the polyesters to contain alpha-methylene groups, at least part of the dicarboxylic acid component must be an alpha-methylene acid. Some of the polyesters prepared in the Examples are acrylate-terminated.

SUMMARY OF THE INVENTION

There is now provided a method for the production of prepregs in which cellulosic fibres are impregnated with a water-borne composition comprising
(a) a photopolymerisable resin, and
(b) an epoxide resin,
preferably in the presence of a photosensitiser for (a) and of a heat-activated curing agent for (b),
and then the impregnated fibres are exposed to actinic radiation so that (a) becomes photopolymerised, (a) being of formula

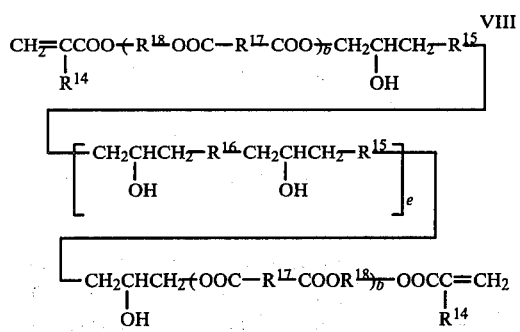

VIII where
b represents zero or 1,
e is an integer of at least 1,
each R¹⁴ denotes a hydrogen atom or a methyl group, each R¹⁵ represents the divalent residue of a compound having two glycidyl groups directly attached to an atom or atoms of oxygen, nitrogen, or sulphur, after removal of the said two glycidyl groups, each R¹⁶ represents the divalent residue of a dihydric alcohol, a dihydric phenol, a dicarboxylic acid, or a compound containing two groups selected from amide groups and imide groups, after removal of two terminal hydrogen atoms attached to an atom or atoms of oxygen or nitrogen, each R¹⁷ denotes an alkylene group of 1 to 6 carbon atoms, an alkenylene group of 2 to 10 carbon atoms, an arylene group of 6 to 10 carbon atoms, or a cycloalkylene or cycloalkenylene group of 5 to 8 carbon atoms, each R¹⁸ denotes a divalent aliphatic, cycloaliphatic, or araliphatic group of 2 to 8 carbon atoms, with the proviso that at least 25% of the total of the (e+1) R¹⁵ and e R¹⁶ groups each represent a group of formula

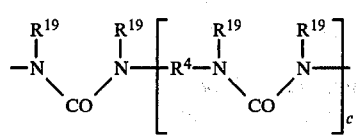

IX or a group of formula

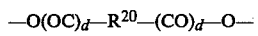

X wherein R⁴ has the meaning previously assigned, c and d are each zero or 1,
each R¹⁹ denotes an alkyl group of 1 to 4 carbon atoms or each pair of R¹⁹ conjointly represents a group of formula

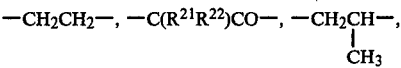

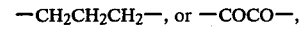

R²⁰ represents a straight chain or branched chain aliphatic group of 2 to 20 carbon atoms or, provided each d is 1, it may alternatively represent a group of formula

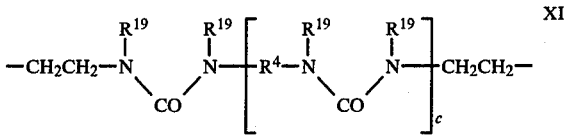

XI and R²¹ and R²² either each denote a hydrogen atom or a straight or branched alkyl group of up to 9 carbon atoms or together they denote a tetramethylene, pentamethylene, methylpentamethylene, or hexamethylene group.

While not necessarily fully soluble in water, the resins of formula VIII are miscible with it and assist in promoting impregnation of the fibres by the epoxide resin.

DETAILED DISCLOSURE

The preferred resins of formula VIII are those wherein e represents an integer of at most 10, especially from 1 to 5. Preferably at most 75% of the total of the (e+1) $R^{15}$ and e $R^{16}$ groups represent a group of formula IX or of formula X where d is 1, and at least 25% of the total of the groups $R^{15}$ and $R^{16}$ -denote either (i) an oxyalkyleneoxy group of 2 to 40 carbon atoms, which may be interrupted in the chain by one or more ether oxygen atoms, that is a group of formula X where d is zero or an oxyalkyleneoxy group of 21 to 40 carbon atoms which is not of formula IX or X, or, especially, (ii) an oxyaryleneoxy group of 6 to 18 carbon atoms.

Further preferred are the compounds of formula VIII wherein at least 25% of the groups $R^{15}$ and $R^{16}$ each denote an oxyalkyleneoxy group, the alkylene component of which is a chain of 3 to 6 consecutive carbon atoms or a chain of 4 to 28 carbon atoms interrupted by one or more ether oxygen atoms, an oxyphenyleneoxy group, or a group of formula

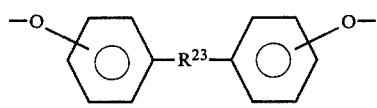   XII where $R^{23}$ represents a carbon-carbon bond, an ether oxygen atom, a carbonyl group, a sulphonyl group, a methylene group, or an isopropylidene group.

When b represents 1, $R^{17}$ and $R^{18}$ both preferably represent alkylene groups of 2 to 6 carbon atoms.

$R^{20}$ preferably represents an alkylene group, which may be interrupted by one or more carbonyloxy groups or by one or more ether oxygen atoms, containing up to 9 carbon atoms.

Particularly preferred are resins containing groups of formula IX where each pair of $R^{19}$ denotes a group of formula —C($R^{21}R^{22}$)CO—, wherein $R^{21}$ is a methyl, ethyl, n-propyl, n-pentyl, neopentyl, sec. amyl, or 2-ethylhexyl group and $R^{22}$ is a methyl group, or $R^{21}$ and $R^{22}$ together denote pentamethylene or hexamethylene.

Specific examples of groups suitable as $R^{15}$ and $R^{16}$, when they are further of formula IX, are

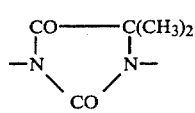   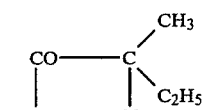

XIII  XIV

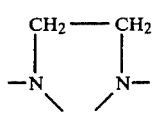   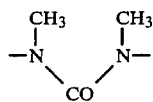

XV  XVI

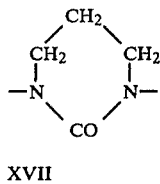   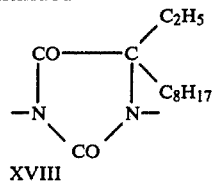

XVII  XVIII

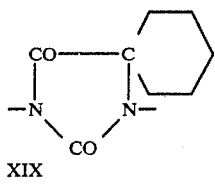   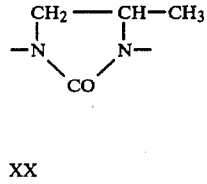

XIX  XX

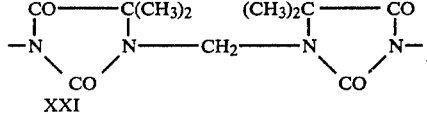

XXI and when they are further of formula X,

—OOC(CH$_2$)$_g$COO—   XXII where g is 2, 3, or 4.

The groups of formulae XI to XXI are respectively the residue of 5,5-dimethylhydantoin, 5-ethyl-5-methylhydantoin, imidazolidin-2-one, 1,3-dimethylurea, hexahydro-2H-pyrimidin-2-one, 5-methyl-5-(2-ethylhexyl)-hydantoin, 5,5-pentamethylenehydantoin, 4-methylimidazolidin-2-one, and 1,1'-methylenebis(5,5-dimethylhydantoin), while the groups of formula XXII are the residue of succinic, glutaric, and adipic acids.

Further examples of suitable groups $R^{15}$ and $R^{16}$, when they are further of formula X, are those of formula

—O(CH$_2$)$_2$O—   XXIII

—O(CH$_2$)$_4$O—,   XXIV

Specific examples of suitable groups $R^{15}$ and $R^{16}$, when they are not further of formula IX or X, are those of formula

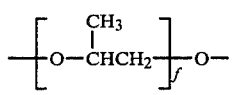   XXV where f is an integer of average value 7.3, and

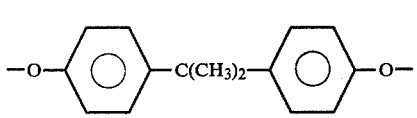   XXVI

The groups of formulae XXIII to XXVI are, respectively, the residues of ethylene glycol, butane-1,4-diol, a poly(oxypropylene) glycol of average molecular weight 425, and 2,2-bis(4-hydroxyphenyl)-propane.

The resins of formula VIII in which b represents zero may be prepared in two stages.

The first involves reaction of a diepoxide of formula

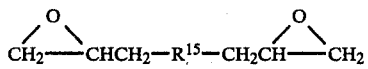

with a dihydric alcohol, a dihydric phenol, a dicarboxylic acid, or an amide or amide-imide of formula $$H-R^{16}-H \qquad \text{XXVIII}$$

to form an advanced, linear diepoxide of formula

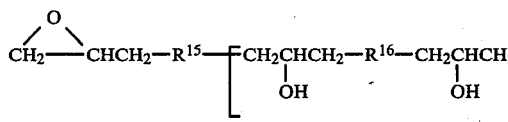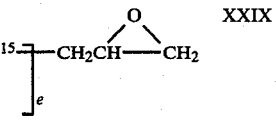

where $e$, $R^{15}$, and $R^{16}$ are as hereinbefore defined.

Usually, the diepoxide of formula XXVII is heated with the compound of formula XXVIII at a temperature within the range 120°–210° C., and especially at 140°–190° C. The reaction can be accelerated by adding suitable catalysts. Such catalysts are, for example, alkali metal hydroxides such as sodium hydroxide; alkali metal halides such as lithium chloride, potassium chloride, and sodium chloride, bromide, or fluoride; tertiary amines such as triethylamine, tri-n-propylamine, N-benzyldimethylamine, N,N'-dimethylaniline, and triethanolamine; quaternary ammonium bases such as benzyltrimethylammonium hydroxide; quaternary ammonium salts such as tetramethylammonium chloride, tetraethylammonium chloride, benzyltrimethylammonium chloride, benzyltrimethylammonium acetate, and methyltriethylammonium chloride; and hydrazines having a tertiary nitrogen atom, such as 1,1-dimethylhydrazine, which can also be employed in their quaternised form. Depending on the choice of the starting substances, the reaction in some cases takes place quantitatively so rapidly that no addition of catalyst is necessary. Whilst the starting materials are generally mixed with one another at room temperature and are then brought to the reaction temperature, it is advantageous in the case of very interreactive components if the diepoxide of formula XXVII is first heated by itself to the requisite reaction temperature and the other reactive components are then gradually added in small proportions. Progress of the reaction up to formation of the end product having a defined epoxide group content which essentially remains constant can be followed by titration of the epoxide groups using samples taken during the reaction.

Such advancement reactions are known (see, e.g., GB No. 1 521 933 mentioned above).

In the second stage, the water-dilutable resin of formula VIII is prepared from the advanced diepoxide of formula XXIX through opening of the terminal epoxide groups by reaction with acrylic acid or methacrylic acid.

This reaction is generally brought about at a temperature of from 60° to 150° C., especially at 100° to 130° C., in the absence of a solvent or in the presence of an inert, polar solvent such as chloroform. The molar ratio of the advanced diepoxide of formula XXIX to acrylic acid or methacrylic acid is preferably such that substantially all the indicated glycidyl groups are converted into (meth)acryloyl-2-hydroxypropyl groups.

Advantageously a catalyst for the ring-opening reaction is present. This catalyst may be sodium acetate, or preferably a tertiary amine such as those listed above, a quaternary ammonium salt such as those listed above, or a salt of trivalent chromium with an alkanoic acid such as octanoic acid and 2-ethylhexanoic acid or with an alkenoic acid such as acrylic acid.

If desired, an inhibitor of free radicals, such as hydroquinone or 2,6-di-tert.butyl-4-methylphenol, may be included in order to lessen the occurrence of side reactions. Such inhibitors need not be removed at the end of the reaction since they do not prevent polymerisation of the product on its exposure to actinic radiation.

The resins of formula VIII in which $b$ represents 1 may be prepared from the advanced, linear diepoxides of formula XXIX by opening of the terminal epoxide groups on reaction with a diacid of formula $$HOOC-R^{17}-COOH \qquad \text{XXX}$$

where $R^{17}$ has the meaning previously assigned, or an anhydride of a diacid of formula XXX, followed by esterification of the thus formed terminal carboxylic acid groups with a hydroxy group-containing ester of acrylic or methacrylic acid, of formula

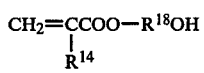

where $R^{14}$ and $R^{18}$ have the meanings previously assigned.

Ring-opening of the epoxide groups is generally effected under the same conditions as those described above for the ring-opening the diepoxides of formula XXIX with acrylic or methacrylic acid, i.e., a temperature of 60°–150° C. in the presence of a catalyst and optionally of an inhibitor of free radicals.

Esterification using a hydroxy ester of formula XXXI may be carried out under conventional esterification conditions, particularly by heating at 60° to 150° C., especially at 100° to 130° C., in the absence of a solvent or in an inert, preferably water-immiscible, solvent, and optionally in the presence of a dehydrating agent. If desired, these two stages may be carried out as a single reaction, by mixing the reactants in a single vessel and heating.

Epoxide resins suitable for use as component (b) in the method of this invention include diglycidyl ethers of polyhydric phenols such as bisphenol A (2,2-bis(4-hydroxyphenyl)propane) and tetrabromobisphenol A (2,2-bis(3,5-dibromo-4-hydroxyphenyl)propane), and epoxide resins obtained by advancement of these diglycidyl ethers. The use of water-soluble N,N-diglycidyl compounds, especially N,N'-diglycidylhydantoins, as the epoxide resin component is particularly preferred.

The cellulosic fibres may be in loose, or woven or nonwoven sheet form, and are preferably of cotton or paper.

The weight ratio of component (a), i.e., the resin of formula VIII, to component (b), i.e., the epoxide resin, may be varied between wide limits, but is preferably within the range 1:0.5–4.

The fibres can be impregnated by conventional means. In general, the proportion of water is not critical but to avoid the necessity of drying the amount should be restricted, e.g., to about 2 to 30% by weight calculated on the water-borne composition. The uptake of the composition is usually 50 to 300%, preferably 50 to 150%, by weight, calculated on the weight of the fibres.

The impregnating mixture may also contain conventional additives such as flame retardants.

In the method of this invention actinic radiation of wavelength 200 to 600 nm is preferably used.

As already indicated, the impregnated fibres are preferably exposed to actinic radiation in the presence of a photosensitiser. Conveniently the photosensitiser is applied in the impregnating composition. Suitable sensitisers include quinones, diphenylcarbinols, 5-nitroacenaphthene, 2-substituted thioxanthones, diphenylmethanes, α-haloacetophenones such as p-tert-.butylphenyl trichloromethyl ketone; photoredox catalysts such as a mixture of a phenothiazine dye (e.g., methylene blue) or a substituted quinoxaline with an electron-donating agent (such as sulphinic acid or salt of a sulphinic acid, a phosphine, an arsine, or thiourea), benzophenones, benzil dialkyl ketals such as benzil dimethyl ketal (i.e., α-methoxybenzoin methyl ether), benzoins, benzoin alkyl ethers, and O-alkoxycarbonyl derivatives of an oxime of benzil or 1-phenylpropane-1,2-dione, such as benzil (O-ethoxycarbonyl)-α-monoxime and 1-phenylpropane-1,2-dione 2-(O-ethoxycarbonyl)oxime. Preferred sensitisers are Michler's ketone (i.e., 4,4'-bis(dimethylamino)benzophenone), benzoin n-butyl ether and mixtures of these two; metal salts of 2-(m- or p-methoxyphenyl)quinoxaline-6'- or -7'-sulphonic acids mixed with a metal salt of toluene-p-sulphinic acid; 1-phenylpropane-1,2-dione 2-(O-ethoxycarbonyl)oxime, benzil dimethyl ketal and mixtures of these two; and 2-chlorothioxanthone and its mixtures with benzil dimethyl ketal. Usually from 0.1 to 20%, and preferably from 0.5 to 15%, by weight of the sensitiser, calculated on the weight of component (a) is employed.

Suitable sources of actinic radiation include carbon arcs, mercury vapour arcs, fluorescent lamps with phosphors emitting ultra-violet light, argon and xenon glow lamps, tungsten lamps, and photographic flood lamps. Of these, mercury vapour arcs, particularly sun lamps, fluorescent sun lamps, and metal halide lamps are most suitable. The time required for the exposure of the impregnated fibres will depend upon a variety of factors which include, for example, the individual component (a) being utilised, the type of light source, and its distance from the fibres may readily be determined by routine experimentation.

There is also herein provided a method of preparing a composite article which comprises heat-curing a prepreg made by the process of this invention.

As has also been already indicated, the cellulosic fibres are preferably also impregnated with a heat-curing amount of a latent, heat-curing agent for the epoxide resin (b). Such agents are well known, and include dicyandiamide (alone or mixed with an N,N-dimethyl-N'-arylurea such as a bis(N,N-dimethylureido)toluene or N,N-dimethyl-N'-(4-chlorophenyl)urea), imidazoles, and complexes of boron trichloride or of boron trifluoride with amines. It is convenient to apply these agents in the water-borne composition containing (a) and (b).

Suitable conditions of heat and pressure to be used in forming the heat-cured composite, which will generally be in the form of a multilayer laminate, are readily ascertainable by those skilled in the art of epoxide resins, using routine methods.

The following Examples illustrate the invention.

Epoxide resins and photopolymerisable resins used in the Examples are prepared as follows. Epoxide contents are measured by titration against a 0.1 N solution of perchloric acid in glacial acetic acid in the presence of excess of tetraethylammonium bromide, crystal violet being used as the indicator. All parts and percentages are by weight.

EPOXIDE RESIN A

N,N'-Diglycidyl-5,5'-dimethylhydantoin (8.04 epoxide equiv./kg, 100 g), bisphenol A diglycidyl ether (5.30 epoxide equiv./kg, 100 g), 1,4-butane diol (37.2 g) and N-phenylimidazole (0.2 g) are stirred at 120° C. for 5 hours. A further portion of 2-phenylimidazole (0.2 g) is added and the heating is continued at 120° C. for another 5 hours and then at 140° C. for 6½ hours, by which time the epoxide content of the mixture is 2.44 equiv./kg.

EPOXIDE RESIN B

N,N'-Diglycidyl-5,5-dimethylhydantoin (8.04 epoxide equiv./kg, 100 g), a diglycidyl ether of a polyoxypropylene glycol of average molecular weight 425 (3.07 epoxide equiv./kg, 200 g), bisphenol A diglycidyl ether (5.30 epoxide equiv./kg, 100 g), bisphenol A (100 g) and N-phenylimidazole (0.4 g) are stirred at 120° C. for 3½ hours, by which time the epoxide content of the mixture is 2.67 epoxide equiv./kg.

EPOXIDE RESIN C

N,N'-Diglycidyl-5,5 pentamethylenehydantoin (6.23 epoxide equiv./kg, 200 g), 1,4-butanediol (36 g), and N-phenylimidazole (0.4 g) are stirred at 140° C. for 12¼ hours and then at 160° C. for 3¾ hours, by which time the epoxide content has fallen to 2.35 epoxide equiv./kg.

EPOXIDE RESIN D

Adipic acid (73 g) is added in portions with stirring to N,N'-diglycidyl-5,5-dimethylhydantoin (8.04 epoxide equiv./kg, 200 g) containing N-phenylimidazole (0.4 g), the temperature is kept at 100° C. and the addition is carried out over 40 minutes. The heating is maintained at 100° C. for a further 4⅓ hours by which time the epoxide content has fallen to 2.35 equiv./kg.

PHOTOPOLYMERISABLE RESIN I 5,5-Dimethylhydantoin (77.4 g) is added portionwise to a stirred mixture of 1,4-butanediol diglycidyl ether (epoxide content 8.6 equiv./kg, 200 g) containing tetramethylammonium chloride (0.25 g) as catalyst for the advancement. The mixture is heated to 120° C. and an exothermic reaction commenced which raises the temperature to 230° C. The mixture is then cooled to 100° C.; it has an epoxide content of 2.2 equiv./kg. 2,6-Di-t-butyl-4-methylphenol (0.44 g) is added as a polymerisation inhibitor, followed, over 1 hour, by methacrylic acid (54.6 g) and 2,6-di-t-butyl-4-methylphenol (0.88 g). The mixture is heated at 100° C. for 3½ hours, by which time its epoxide content has fallen to a low value (0.6 equiv./kg).

This product is substantially of formula VIII, where b denotes zero, each $R^{14}$ denotes a methyl group, each $R^{15}$ denotes a group of formula XXIV, and each $R^{16}$ denotes a group of formula XIII.

PHOTOPOLYMERISABLE RESIN II

N,N'-Diglycidyl-5,5-dimethylhydantoin (7.88 epoxide equiv./kg, 50 g), containing 2 drops of a 5% solution of chromium III trisoctanoate in light petroleum ether as catalyst for subsequent reaction with acrylic acid, is heated to 100° C. and adipic acid (14 g) is added over 1 hour. When the addition has been completed the mixture was heated for a further 1¾ hours at 100° C., by which time its epoxide content is 3.96 equiv./kg. Over 30 minutes there are added to the resin at 100° C. acrylic acid (8.1 g) containing 0.1 g of 2,6-di-t-butyl-4-methylphenol and a further 2 drops of the chromium III trisoctanoate solution, and heating is continued for 6½ hours at 100° C. The epoxide content of the product is 0.46 equiv./kg.

This product is substantially of formula VIII, where b denotes zero, each $R^{14}$ denotes a hydrogen atom, each $R^{15}$ denotes a group of formula XIII, and each $R^{16}$ denotes a group of formula XXII where g is 4.

PHOTOPOLYMERISABLE RESIN III

A solution containing acrylic acid (20.8 g), 2,6-di-t-butyl-4-methylphenol (0.2 g), and a 5% solution of chromium III trisoctanoate in light petroleum ether (0.1 g) is added over ½ hour, with stirring, to Epoxide Resin A (118.6 g) at 100° C. When the addition has been completed, the mixture is heated for a further 5½ hours at 100° C., by which time its epoxide content has fallen to a negligibly low value (0.07 equiv./kg). Water (23.1 g) is added.

The product is substantially of formula VIII, where b represents zero, some of the groups $R^{15}$ are of formula XIII and the remainder are of formula XXVI, the groups $R^{16}$ are oxybutyleneoxy groups, and $R^{14}$ denotes a hydrogen atom.

PHOTOPOLYMERISABLE RESIN IV

A solution containing acrylic acid (50.3 g), 2,6-di-t-butyl-4-methylphenol (0.6 g), and a 5% solution of chromium III trisoctanoate in light petroleum ether (0.3 g) is added over ½ hour, with stirring, to Epoxide Resin B (261.5 g) at 100° C. The heating at 100° C. is continued for a further 4½ hours, by which time the epoxide content has fallen to a negligibly low value (0.08 epoxide equiv./kg).

The product is substantially of formula VIII, where b represents zero, some groups $R^{15}$ are of formula XIII, some groups $R^{15}$ are of formula XXV and the remainder are of formula XXVI, the groups $R^{16}$ are also of formula XXVI, and $R^{14}$ denotes a hydrogen atom.

PHOTOPOLYMERISABLE RESIN V

Epoxide Resin C (118 g) is stirred at 100° C. and a solution containing methacrylic acid (23.8 g), 2,6-di-t-butyl-4-methylphenol (0.4 g), and a 5% solution of chromium III trisoctanoate in light petroleum ether (0.1 g) is added over ½ hour. The heating is continued at 100° C. for a further 4⅛ hours, by which time the epoxide content has fallen to a negligible value (0.28 equiv./kg). Water (45 g) is added.

The product is substantially of formula VIII, where b denotes zero, each $R^{14}$ denotes a methyl group, each $R^{15}$ denotes a group of formula XIX and each $R^{16}$ denotes a group of formula XXIV.

PHOTOPOLYMERISBALE RESIN VI

Epoxide Resin D (273 g) is stirred at 100° C. and a solution containing acrylic acid (46.2 g), 2,6-di-t-butyl-4-methylphenol (0.6 g), and a 5% solution of chromium III trisoctanoate in light petroleum ether (0.3 g) is added over ½ hour. The heating is continued for a further 2 hours, when the epoxide content has fallen to a negligible value (0.34 equiv./kg). Water (30 g) is added.

The product is substantially of formula VIII, where b denotes zero, each $R^{14}$ denotes a hydrogen atom, $R^{15}$ denotes a group of formula XIII and each $R^{16}$ denotes a group of formula XXII.

PHOTOPOLYMERISABLE RESIN VII

To diglycidyl hexahydrophthalate (6.4 epoxide equiv./kg, 41.2 g), containing tetramethylammonium chloride (0.1 g) and heated to 100° C., 5,5-dimethylhydantoin (10.2 g) is added portionwise over 1 hour. The mixture is then stirred at 100° C. for 4 hours, by which time the epoxide content has fallen to 2.45 equiv./kg.

In a separate vessel, succinic anhydride (30 g), 2-hydroxyethyl acrylate (34.2 g), tetramethylammonium chloride (0.2 g), and 2,6-di-t-butyl-4-methylphenol (0.15 g) are stirred at 90° C. for 3 hours. The mixture is then cooled. The product, i.e., 3-(2-(acryloyloxy)ethoxycarbonyl)propionic acid, (27.2 g) is mixed with 2,6-di-t-butyl-4-methylphenol (0.1 g) and added over 1 hour to the advanced resin at 100° C., and the mixture is stirred for a further 4½ hours at 100° C., by which time its epoxide content is negligible. The product is diluted with 33% of water.

The product is substantially of formula VIII where b represents 1, $R^{17}$ and $R^{18}$ both represent $-CH_2CH_2-$, $R^{14}$ represents a hydrogen atom, $R^{15}$ represents hexahydrophthaloyl, and $R^{16}$ represents a group of formula XIII.

EXAMPLE 1

Photopolymerisable Resin I (10 parts) is mixed with 40 parts of an epoxide resin, namely, N,N'-diglycidyl-5,5-dimethylhydantoin (7.88 epoxide equiv./kg), 2 parts of water, 0.5 part of benzil dimethyl ketal, and 1 part of boron trichloride-trimethylamine complex.

The resultant clear solution is used to impregnate electrical grade kraft paper weighing 60 g per square meter, the uptake being 100% calculated on weight of paper. The impregnated paper is irradiated for 30 seconds on each side with a 80 w per cm medium pressure mercury lamp at 25 cm distance to give a slightly tacky prepreg. Four layers of this are stacked, heat-cured in a press at 120° C. for 1 hour under a pressure of 7 MPa, then post-cured by heating for 2 hours at 140° C. The laminate is hard and rigid, and is undamaged by the piercing test specified in British Standard No. 5102:1974, Appendix R.

EXAMPLE 2

Photopolymerisable Resin I (15 parts) is mixed with 20 parts of each of two epoxide resins, namely N,N'-diglycidyl-5,5-dimethylhydantoin (7.88 epoxide equiv./kg) and N,N'-diglycidyl-5,5-dimethylhydantoin which has been advanced with tetrabromobisphenol A to an epoxide content of 2.0 equiv./kg, 2.0 parts of water, 0.5 part of 2-chlorothioxanthone, 2.0 parts of dicyandiamide, and 0.5 part of N-(4-chlorophenyl)-N',N'-dimethylurea.

This mixture is used to impregnate kraft paper as described in Example 1, and irradiated for 10 seconds on each side with a 80 w per cm medium pressure mercury lamp at a distance of 25 cm to give a slightly tacky prepreg. Four layers of this are stacked and heat-cured in a press at 120° C. under a pressure of 7 MPa for 1 hour. The resultant cured laminate is hard and rigid and was undamaged by the piercing test specified above.

EXAMPLE 3

Photopolymerisable Resin II (20 parts) is mixed with 20 parts of an epoxide resin, i.e., N,N'-diglycidyl-5,5-dimethylhydantoin, 10 parts of water, 0.2 part each of benzil dimethyl ketal and 1-phenyl-1,2-propanedione 2-(O-ethoxycarbonyl)oxime, 2.6 parts of a mixture of 2,4- and 2,6-bis(N,N-dimethylureido)-toluene, and 0.65 part of dicyandiamide. On warming the mixture to 60° C. a clear solution is formed. Kraft paper weighing 350 g per square meter is impregnated with the solution, the uptake being 100% calculated on the weight of paper. The impregnated paper is irradiated for 5 seconds on each side with the lamp used in Example 1, a tack-free prepreg is obtained. Four layers of the prepreg are stacked and then heated for 5 minutes at 120° C. with only nominal pressure, and then heating at 120° C. is continued while the laminate is pressed at 7 MPa for 3 cycles of 2 minutes each, with the pressure being released for 30 seconds between each cycle. Finally, the laminate is heated for 1 hour under 7 MPa pressure, a well-consolidated product is obtained in which holes could be readily punched without deformation; its resin content is 41%.

EXAMPLE 4

Photopolymerisable Resin VII (60 parts) is mixed with 45 parts of Epoxide Resin C, 5 parts of water, 0.6 part of benzil dimethyl ketal and 2 parts of boron trichloride-octyldimethylamine complex.

The resultant clear solution is used to impregnate electrical grade kraft paper weighing 75 g per square meter, the uptake being 100% calculated on the weight of the paper. The impregnated paper is irradiated for 3 seconds on each side with a 80 w per cm medium pressure mercury lamp at a distance of 25 cm to give a tack-free prepreg. Six layers of this are stacked and heated in a press at 120° C. for 1 hour under a pressure of 7 MPa. The resultant laminate is hard and rigid and undamaged by the piercing test specified above.

EXAMPLE 5

Photopolymerisable Resin III (50 parts) is mixed with 25 parts of Epoxide Resin A, 5 parts of water, 0.5 part of benzil dimethyl ketal, and 1 part of boron trifluoride-monoethylamine complex.

The resultant clear solution is used to impregnate electrical grade kraft paper weighing 75 g per square meter, the uptake being 150% calculated on the weight of the paper. The impregnated paper is irradiated for 5 seconds on each side with an 80 w per cm medium pressure mercury lamp at 25 cm distance to give a tack-free prepreg. Eight layers of this are stacked and heat-cured in a press at 120° C. for 1 hour under a pressure of 7 MPa. The resultant laminate is well consolidated and is undamaged by the piercing test specified above.

EXAMPLE 6

Photopolymerisable Resin IV (40 parts) is mixed with 25 parts of Epoxide Resin B, 5 parts of water, 0.5 part of benzil dimethyl ketal, and 0.5 part of N-phenylimidazole.

The resultant clear solution is used to impregnate electrical grade kraft paper weighing 75 g per square meter, the uptake being 200% calculated on the weight of paper. The impregnated paper is irradiated for 8 seconds on each side with an 80 w per cm medium pressure mercury lamp at a distance of 25 cm to give a slightly tacky prepreg. Six layers of this are stacked and heat-cured in a press at 120° C. for 1 hour under a pressure of 7 MPa. The resultant laminate is hard and rigid and is undamaged by the piercing test specified above.

EXAMPLE 7

Photopolymerisable Resin V (30 parts) is mixed with 25 parts of Epoxide Resin B, 0.3 part of benzil dimethyl ketal, and 0.3 part of boron trichloride-trimethylamine complex.

The mixture is warmed to 60° C. to obtain a clear solution which is used to impregnate a woven cotton cloth weighing 120 g per square meter, the uptake being 275% calculated on the weight of the cotton. The impregnated cotton is irradiated for 2 seconds on each side with an 80 w per cm medium pressure mercury lamp at 25 cm distance to give a tack-free prepreg. Six layers of this are stacked and heat-cured in a press at 120° C. for 1 hour under a pressure of 7 MPa. The resultant laminate is hard and flexible and is undamaged by the piercing test specified above.

EXAMPLE 8

Photopolymerisable Resin VI (30 parts) is mixed with 25 parts of Epoxide Resin B, 5 parts of water, 0.5 part of benzil dimethyl ketal and 0.5 part of boron trichloride-trimethylamine complex.

The resultant clear solution is used to impregnate a woven cotton cloth weighing 120 g per square meter, the uptake being 50% calculated on the weight of the cotton. The impregnated cotton is irradiated for 5 seconds on each side with a 80 w per cm medium pressure mercury lamp at a distance of 25 cm to give a tack-free prepreg. Four layers of this are stacked and heat-cured in a press at 120° C. for 1 hour under a pressure of 7 MPa. The resultant laminate is hard and flexible and is undamaged by the piercing test specified above.

What is claimed is:

1. A method for the production of prepregs which comprises (1) impregnating cellulosic fibers with a water-borne composition comprising
   (a) a photopolymerisable resin, and
   (b) an epoxide resin, and then (2) exposing the impregnated fibers to actinic radiation so that (a) becomes photopolymerised, (a) being of formula

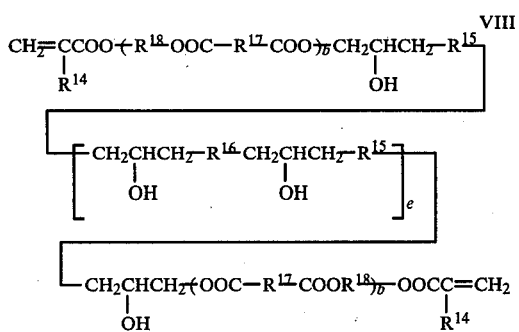

where
b represents zero or 1,
e is an integer of at least 1,
each $R^{14}$ denotes a hydrogen atom or a methyl group,
each $R^{15}$ represents the divalent residue of a compound having two glycidyl groups directly attached to an atom or atoms of oxygen, nitrogen, or sulphur, after removal of the said two glycidyl groups,
each $R^{16}$ represents the divalent residue of a dihydric alcohol, a dihydric phenol, a dicarboxylic acid, or a compound containing two groups selected from amide groups and imide groups, after removal of two terminal hydrogen atoms attached to an atom or atoms of oxygen or nitrogen,
each $R^{17}$ denotes an alkylene group of 1 to 6 carbon atoms, an alkenylene group of 2 to 10 carbon atoms, an arylene group of 6 to 10 carbon atoms, or a cycloalkylene or cycloalkenylene group of 5 to 8 carbon atoms,
each $R^{18}$ denotes a divalent aliphatic, cycloaliphatic, or araliphatic group of 2 to 8 carbon atoms,
with the proviso that at least 25% of the total of the (e+1) $R^{15}$ and e $R^{16}$ groups each represent a group of the formula

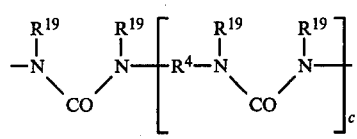

or a group of formula

—O(OC)$_d$—R$^{20}$—(CO)$_d$—O—     X wherein
$R^4$ represents a divalent aliphatic, cycloaliphatic, or araliphatic radical of 1 to 8 carbon atoms,
each $R^{19}$ denotes an alkyl group of 1 to 4 carbon atoms or each pair of $R^{19}$ conjointly represents a group of formula

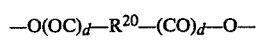

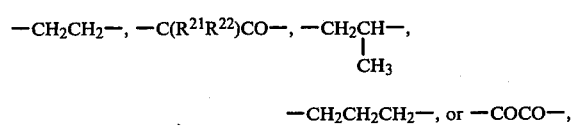

c and d are each zero or 1,
$R^{20}$ represents a straight or branched chain aliphatic group of 2 to 20 atoms or, provided each d is 1, it may alternatively represent a group of formula

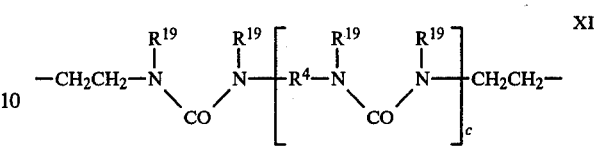

and
$R^{21}$ and $R^{22}$ either each denote a hydrogen atom or a straight or branched alkyl group of up to 9 carbon atoms or together they denote a tetramethylene, pentamethylene, methylpentamethylene, or hexamethylene group.

2. The method of claim 1, in which e is an integer of 1 to 10.

3. The method of claim 1, in which $R^{20}$ represents an alkylene group, which may be interrupted by one or more carbonyloxy groups or by one or more ether oxygen atoms, of up to 9 carbon atoms.

4. The method of claim 1, in which at most 75% of the total of the (e+1) $R^{15}$ and e $R^{16}$ groups represent a group of formula IX or a group of formula X where d is 1, and at least 25% of the $R^{15}$ and $R^{16}$ groups denote an oxyalkyleneoxy group of 2 to 40 carbon atoms (which may be interrupted in the chain by one or more ether oxygen atoms) or an oxyaryleneoxy group of 6 to 18 carbon atoms.

5. The method of claim 4, in which the alkylene component of the said oxyalkyleneoxy group comprises a chain of 3 to 6 consecutive carbon atoms or a chain of 4 to 28 carbon atoms which is interrupted by one or more ether oxygen atoms, and the oxyaryleneoxy group is either an oxyphenyleneoxy group or a group of formula

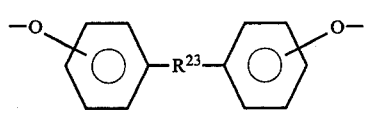

where $R^{23}$ represents a carbon-carbon bond, an ether oxygen atom, a carbonyl group, a sulphonyl group, a methylene group, or an isopropylidene group.

6. The method of claim 1, in which each pair of $R^{19}$ denotes a group of formula —C($R^{21}R^{22}$)CO—, wherein $R^{21}$ is a methyl, ethyl, n-propyl, n-pentyl, neopentyl, sec. amyl, or 2-ethylhexyl group and $R^{22}$ is a methyl group, or $R^{21}$ and $R^{22}$ together denote pentamethylene or hexamethylene.

7. The method of claim 1, in which (b) is a diglycidyl ether of a polyhydric phenol, an advancement product of such a diglycidyl ether, or a water-soluble N,N-diglycidyl compound.

8. The method of claim 1, in which the cellulosic fibers are also impregnated with a heat-curing amount of a heat-curing agent for (b).

9. The method of claim 1, in which the water-borne composition contains 2 to 30% by weight of water.

10. A method of making a composite article which comprises heat-curing a prepreg produced by the method of claim 1.

* * * * *